United States Patent
Naeimi et al.

(10) Patent No.: US 9,520,192 B2
(45) Date of Patent: Dec. 13, 2016

(54) RESISTIVE MEMORY WRITE OPERATION WITH MERGED RESET

(71) Applicants: Helia Naeimi, Santa Clara, CA (US); Shih-Lien L Lu, Portland, OR (US); Charles Augustine, Portland, OR (US)

(72) Inventors: Helia Naeimi, Santa Clara, CA (US); Shih-Lien L Lu, Portland, OR (US); Charles Augustine, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 55 days.

(21) Appl. No.: 14/320,609

(22) Filed: Jun. 30, 2014

(65) Prior Publication Data
US 2015/0380088 A1    Dec. 31, 2015

(51) Int. Cl.
| | | |
|---|---|---|
| *G06F 12/00* | (2006.01) | |
| *G11C 14/00* | (2006.01) | |
| *G06F 12/08* | (2016.01) | |
| *G06F 13/00* | (2006.01) | |
| *G06F 13/28* | (2006.01) | |

(52) U.S. Cl.
CPC ....... *G11C 14/0036* (2013.01); *G06F 12/0811* (2013.01); *G11C 14/0081* (2013.01); *G06F 2212/283* (2013.01)

(58) Field of Classification Search
CPC ............. G11C 14/0081; G11C 14/0036; G06F 12/0811; G06F 2212/283
USPC ......................................................... 711/105
See application file for complete search history.

(56) References Cited

U.S. PATENT DOCUMENTS

| | | | | |
|---|---|---|---|---|
| 2003/0193831 | A1* | 10/2003 | Baker | G11C 11/16 365/225.5 |
| 2007/0171704 | A1* | 7/2007 | Hung | G11C 11/5607 365/158 |
| 2008/0198648 | A1* | 8/2008 | Lee | G11C 11/16 365/171 |
| 2013/0094283 | A1* | 4/2013 | Berger | G11C 8/08 365/158 |

* cited by examiner

*Primary Examiner* — Mark Giardino, Jr.
(74) *Attorney, Agent, or Firm* — Compass IP Law PC (57) ABSTRACT

In a memory device where writing a memory cell to a first bit state takes longer than writing to the second bit state, selectively executing the write operation can amortize the performance cost of writing the bit state that takes longer to write. Write logic dequeues multiple cachelines from a write buffer and sets all bits of all cachelines to the first bit state in a single write operation. The write logic then executes separate write operations on each cacheline separately to selectively write memory cells of each respective cacheline to the second bit state.

20 Claims, 5 Drawing Sheets

RESISTIVE MEMORY WRITE OPERATION WITH MERGED RESET

FIELD

Embodiments of the invention are generally related to memory device writes, and more particularly to improved write operation in magnetoresistive memory devices.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described-below: Copyright © 2014, Intel Corporation, All Rights Reserved.

BACKGROUND

Computing devices rely on memory or storage devices to store data and commands that enable the computing devices to perform their functions. Currently many computing systems use multiple different types of memory devices, due to the performance and characteristics of the different memory devices. There has been research into providing a universal memory that can fill the different roles of the traditional different memory types. Magnetic-based memory (MRAM (magnetoresistive random access memory)) devices have many characteristics that are desired for a universal memory.

Traditionally a computing device might use DRAM (dynamic random access memory), SRAM (static random access memory), and Flash in the same device for different applications. SRAM is typically very fast and is traditionally favored for processor cache applications. DRAM provides very high density and is traditionally favored for main system memory. However, both SRAM and DRAM are volatile, meaning their state becomes non-deterministic in the event power is interrupted to the device. Flash is nonvolatile, and so will maintain deterministic state in the event of interruption of power, but is much slower than SRAM or DRAM. Additionally, flash degrades over time due to the write mechanism, and thus has a limited number of write cycles. SRAM does not provide the density available with DRAM, and tends to use more power than DRAM, even though DRAM requires regular refreshing.

Magnetic memory has been shown to have similar access speeds traditionally associated with SRAM, and provides densities traditionally associated with DRAM. Magnetic memory uses much less power than DRAM or SRAM. Additionally, magnetic memory can be nonvolatile such as flash, but does not suffer the same degradation. However, there are many issues with magnetic memory. One significant challenge with magnetic memory is its write energy and write time. Writing to a magnetic memory can be asymmetrical, where writing to one state is much more costly than writing to the other. For example, in STT (spin transfer torque) memory devices (e.g., STTRAM), writing to an AP (anti-parallel) state takes an order of magnitude longer than writing to a P (parallel) state.

Traditional approaches to the asymmetrical write performance of STTRAM fall under one of the two categories: 1) Trading off persistence to improve write performance; and, 2) Early termination. With persistence trade, a system uses a low-retention time design with less reliable cells to have better write performance. However, such an approach can significantly impair the usefulness of STTRAM. With early termination, a system can detect when a cell is switched and terminate the write operations per cell to prevent unnecessary current flowing through the magnetic terminal junction (MTJ). However, early termination does not improve worst case write performance, which means it has no effect on overall write latency, seeing that a system has to plan for worst case latency to ensure deterministic operation.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a system performs a merged reset to reduce an overall write time for a memory device where writing a memory cell to a first bit state takes longer than writing to the second bit state. The system can selectively execute the write operation in a merged manner by resetting multiple cachelines in a single operation to reduce sequential operation delays. Thus, the system can amortize the performance cost of writing the bit state that takes longer to write. Write logic in the memory device can dequeue multiple cachelines from a write buffer and set all bits of all cachelines to the slower bit state (i.e., the one that takes longer to write) in a single write operation. The write logic then executes separate write operations on each cacheline separately to selectively write memory cells of each respective cacheline to the less expensive bit state.

The merged write operation described herein uses a regional RESET operation to improve the write performance on a memory array, by resetting multiple cachelines at the same time or in response to the same operation. It will be understood that "resetting" a memory cell refers to setting the memory cell to a default state. Typically a reset operation sets a memory cell to zero. In one embodiment, a reset can set a memory cell to one. The merged resetting or merged setting multiple cachelines to the slower memory cell state is combined with selective writing. With selective writing, any pattern of bits can be modified on a memory line or cacheline without changing the content of the other bits. Thus, the system applies one operation to set multiple cachelines to the same state together, and can then selectively write bits of each cacheline individually to the less expensive state.

For example, consider one instance of STT memory devices, where writing a zero takes 20 ns, while writing a one takes 3.4 ns. In a conventional write procedure, the system would require 20 ns to complete the write operation in each and every line, because it will be designed to cover the worst case. The merged write operation discussed herein can significantly improve the overall operation. In one embodiment, the memory device recognizes a difference between writing zeroes and writing ones, and can use the following procedure: select multiple cachelines and write zeroes on all selected cachelines simultaneously (or in the same write operation). The memory device then selects one of the cachelines and selectively writes ones on the cacheline, repeating the selective writing of ones for all selected cachelines that had zeroes written. In the case of merging even just two cachelines, instead of taking (20+20)ns=40 ns, the same write would take (20+3.4+3.4)/2=13.4 ns, which provides a 33% reduction to finish a write per cacheline. The timing reduction can be further improved by merging three cachelines (20+3.4+3.4+3.4)ns/3=10.1 ns, which provides almost a 50% reduction, or merging ten cachelines (20+10*3.4)ns/10=5.4 ns, which provides a 73% reduction.

Figure 1:
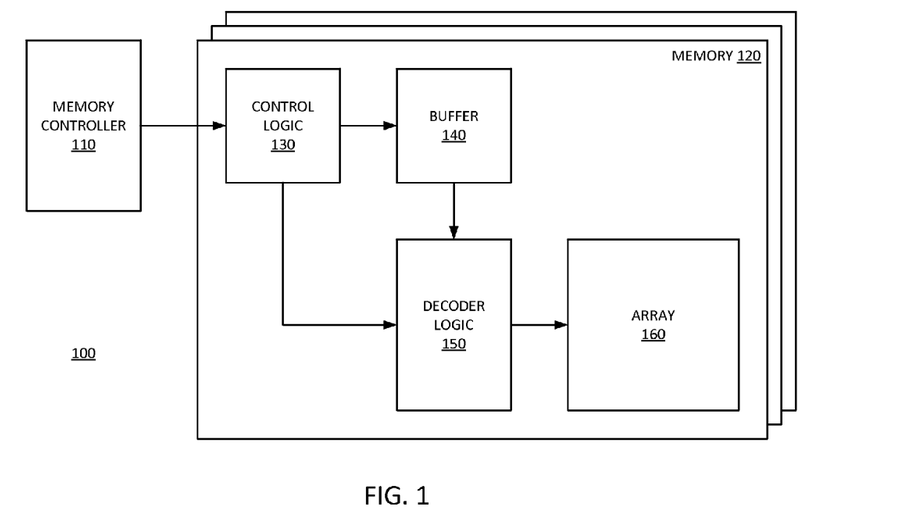
FIG. 1 is a block diagram of an embodiment of a system that applies a merged reset to an array of memory cells.

FIG. 1 is a block diagram of an embodiment of a system that applies a merged reset to an array of memory cells. System 100 represents elements of a memory subsystem of a computing device. More particularly, system 100 includes memory controller 110 and one or more memory devices 120. In one embodiment, one or more memory devices 120 perform a merged write in accordance with what is described herein, and other memory devices do not. Memory controller 110 represents control logic that interfaces with memory device 120 to make access requests to the memory. Memory controller 110 can be a separate logic circuit on a computing device hardware platform or be implemented as part of another circuit element (for example, the memory controller can be part of a CPU (central processing unit) SOC (system on a chip)).

Memory 120 includes control logic 130 to receive and process access commands sent by memory controller 110. Decoder logic 150 represents address decoding logic that accesses one or more cachelines to perform a memory access operation. Array 160 represents an array of memory cells, typically organized or managed as a group of cachelines, each cacheline including multiple bits or memory cells accessed together. Array 160 is an array of memory cells that have write asymmetry, where writing to one bit state is slower than writing to the other bit state. In one embodiment, array 160 includes magnetoresistive memory cells. In one embodiment, the magnetoresistive memory cells are STT memory cells. Decoder logic 150 can select or access multiple cachelines simultaneously, or with a single operation. Thus, memory 120 can select multiple cachelines for a merged write operation.

In one embodiment, memory 120 includes buffer 140, which includes buffer logic to collect multiple cachelines worth of access operations. In one embodiment, buffer 140 is of a fixed size in accordance with a number of cachelines that will be merged for each operation. In one embodiment, control logic 130 can select how many cachelines to dequeue from buffer 140 for a merged operation. The selection can be a dynamic selection or on the fly selection that is made for each operation to be executed within memory 120. In one embodiment, control logic 130 applies one or more criteria to determine how many cachelines to dequeue from buffer 140. The criteria can include determining how much current is available to memory 120 to perform a write operation, how much load there is on memory 120, and/or other criteria. In one embodiment, control logic 130 selects different numbers of rows based on the selection criteria, and thus memory 120 has a page of dynamically reconfigurable size.

Figure 2:
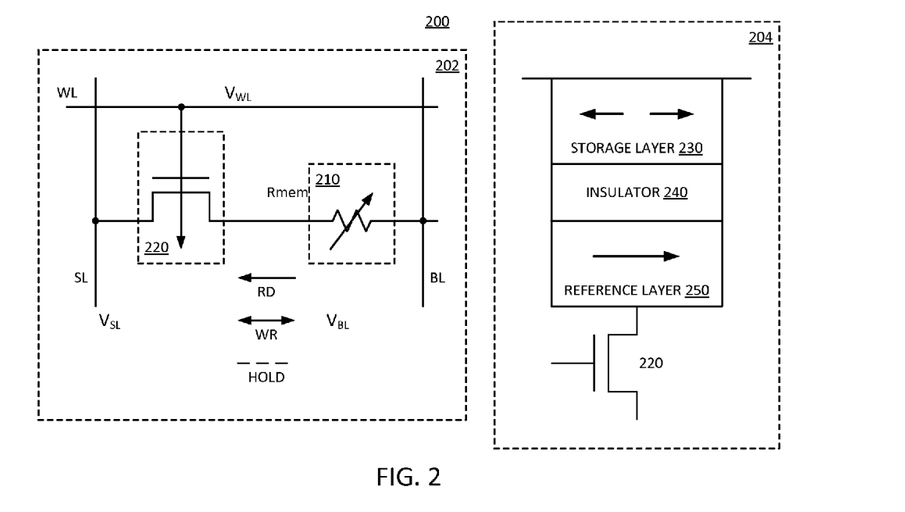
FIG. 2 is a block diagram of an embodiment of a magnetoresistive memory architecture.

FIG. 2 is a block diagram of an embodiment of a magnetoresistive memory architecture. In one embodiment, memory cell 200 is a magnetoresistive memory device illustrated by different representations, diagrams 202 and 204. Memory cell 200 can be one example of a memory cell in array 160 of system 100. In one embodiment, memory cell 200 is represents a spin transfer torque (STT) memory cell that is part of an STTRAM. Diagram 202 illustrates the memory device having three control terminals: a wordline (WL), bitline (BL), and select line (SL). Each line has a separate voltage ($V_{WL}$, $V_{BL}$, and $V_{SL}$, respectively) level that can be applied to execute access operations.

In one embodiment, memory cell 200 stores data by the spin orientation of a soft ferromagnetic material, and uses current induced switching. STT is CMOS (complementary metal-oxide-semiconductor) logic compatible and is scalable. Diagram 204 illustrates that memory cell 200 includes two layers of magnetic materials, reference layer 250, which is a fixed magnetic layer, and storage layer 230, which is a soft or free magnetic layer. When spin-polarized current passes through the storage layer 230, the layer is magnetized to have magnetic orientation either in parallel (low resistance) or anti-parallel (high resistance) with respect to reference layer 250. Thus, polarizing storage layer 230 allows it to store a bit of information, depending on the orientation of the system (e.g., high resistance is typically a zero). Diagram 204 also illustrates insulator 240 (e.g., metal, oxide, or other material) between storage layer 230 and reference layer 250. It will be understood that diagram 204 provides a very basic representation of an STT memory cell, and other layers than those illustrated can be included. In one embodiment, other magnetic layers are included in memory cell 200. In one embodiment, storage layer 230 is adjacent control transistor 220 instead of reference layer 250. Storage layer 230 can represent a magnetic terminal junction (MTJ) that stores the bit value of memory cell 200.

As seen in diagram 202, memory cell or bitcell 200 is read by precharging the bitline to a voltage value of $V_{RD}$ and allowing the charge to decay through memory cell 200 when the wordline is strobed. In one embodiment, a reference bitline is simultaneously drained using a reference cell, which can act as a sense amplifier reference for the memory cell. In one embodiment, both the reference and the accessed bitlines are clamped using a PMOS (p-type MOS) current source, to maintain a constant differential at the sense amplifier input even for very long access times. In one embodiment, a system employs bidirectional writing for writing into memory cell 200. In one embodiment, when writing a one (antiparallel to parallel or AP->P), the bitline is charged to VDD (high voltage reference) and the select line is connected to GND (low voltage reference) to cause current to flow from the bitline to the select line. When writing a zero (P->AP), the memory device applies a current with the opposite direction, which can be achieved by setting the select line at VDD and the bitline at GND, causing current to flow from the select line to the bitline. Write current is illustrated as moving either direction, depending on the value being written. In one embodiment, Read current always flows from the bitline to the select line. Rmem represents the ability to program magnetic device 210 to high or low resistance.

As illustrated, Read current flows from the bitline to the select line for a Read state or Read mode, and Write current can flow in either direction depending on what value is being written for a Write state or Write mode. In one embodiment, memory cell 200 supports a Hold state or Hold mode, where no current flows. In Hold state, memory cell 200 can select the wordline, and the bitline and select line can hold the same voltage. When Vbl and Vsl are equal, no current will flow through the MTJ device, which will then hold the state of the magnet. A Hold state can enable efficient implementation of a selective Write.

Writing a zero (P->AP) can take an order of magnitude longer than writing a one (AP->P) in memory cell 200. It will be understood that "zero" and "one" are conventions used in a specific computing architecture and system, and can be reversed. Thus, in one embodiment, writing a zero is accomplished by changing state from parallel to antiparallel, and writing a one is accomplished by changing state from antiparallel to parallel. In another embodiment, the one and zero convention could be reversed. The write performance asymmetry can be amortized over multiple cachelines by merging write-zero operations and then selectively writing ones on each cacheline.

Figure 3:
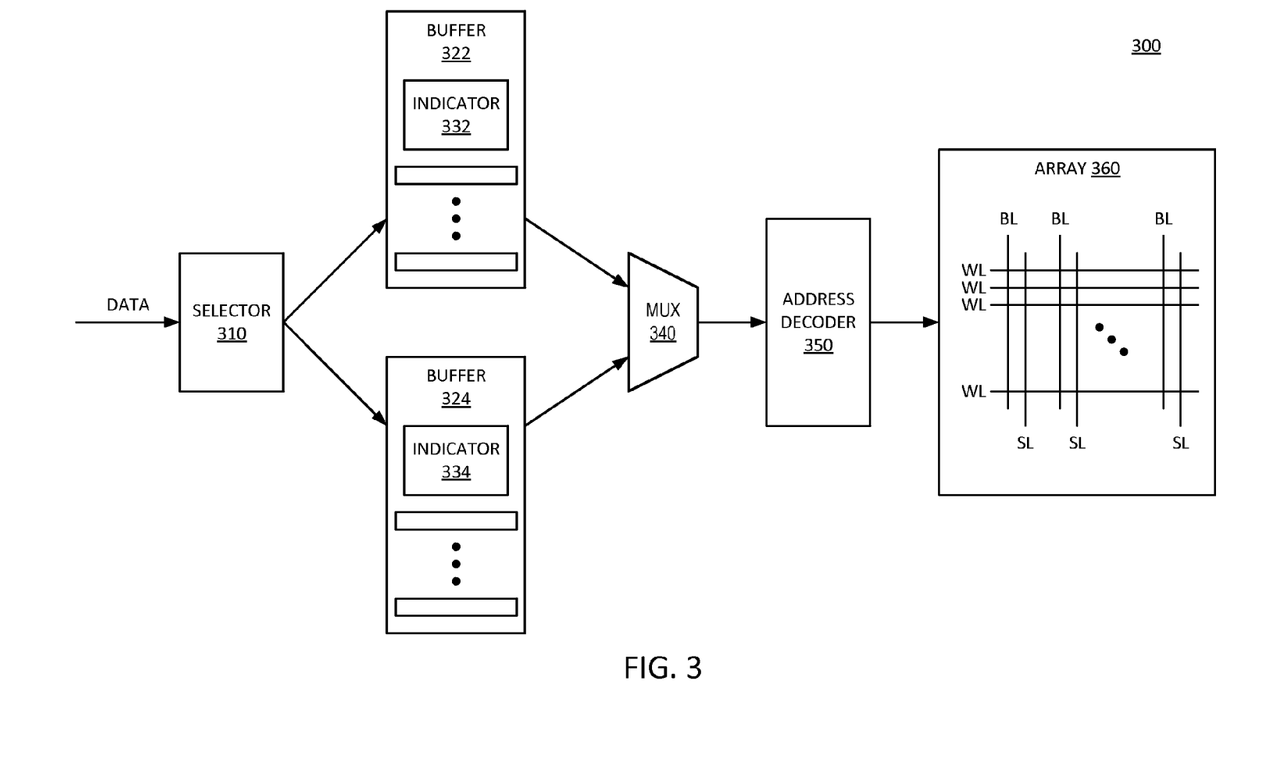
FIG. 3 is a block diagram of an embodiment of a memory device that applies a merged reset from multiple write buffers.

FIG. 3 is a block diagram of an embodiment of a memory device that applies a merged reset from multiple write buffers. System 300 illustrates elements of a memory device, and can be one example of a memory device in accordance with memory device 120 of system 100. The memory device receives data from a memory controller or equivalent circuit that provides memory access requests to system 300. The memory access requests are for cachelines or memory lines of array 360. Array 360 includes magnetoresistive memory or other memory that has an asymmetrical write. Each memory cell of array 360 includes a storage element between a wordline, a bitline, and a select line (as illustrated), and can be, for example, a memory cell in accordance with FIG. 2.

In one embodiment, system 300 includes selector 310, which receives and processes the incoming data access request. In one embodiment, selector 310 is or is a part of control logic or processing logic of a memory device. In one embodiment, system 300 includes two buffers, 322 and 324. With two buffers, system 300 can rotate between filling a buffer and emptying a buffer. Buffer 322 includes indicator 332 which can indicate whether buffer 322 is being filled or whether it is being dequeued or is full. Similarly, buffer 324 includes indicator 334 which can indicate whether buffer 324 is being filled or whether it is full or being dequeued (e.g., "filled" and "being filled" indicators, or "dequeuing" and "being filled"). In one embodiment, indicators 332 and 334 have a codependent binary relationship; thus, indicators 332 and 334 can swap or rotate between states.

In one embodiment, selector 310 determines which buffer to use to queue new incoming write access transactions. Assume for a given instant that selector 310 detects a new incoming write transaction. Selector 310 can check indicators 332 and 334, and place the data to be written in buffer 322 or 324 depending on which buffer is indicated as being filled. Assuming buffer 322 is currently being filled, selector 310 queues the new transaction in buffer 322, and will continue to place incoming write transactions into buffer 322 until it is full. While selector 310 is filling buffer 322, mux 340 selects buffer 324 to dequeue a transaction to send to address decoder 350.

In one embodiment, the buffering can be different. For example, selector 310 can continue to fill buffer 322 until it is full, or can continue to fill buffer 322 until buffer 324 is empty. In such an implementation, system 300 would select mux 340 to dequeue transactions or cachelines from whichever buffer has them. It will be understood that the specific implementation for filling and dequeuing buffers 322 and 324 can depend on the depth of the buffers, the expected load on the system, and/or other factors.

In one embodiment, buffers 322 and 324 have a certain number of entries (e.g., three, four, eight) that all get filled, and then system 300 dequeues the entries via mux 340 to address decoder 350. Address decoder 350 selects all dequeued cachelines to perform a merged operation to set all bits of all selected cachelines to zero (or the slower memory cell state). Address decoder 350 will then selectively cycle through each selected cacheline one at a time to write ones (or the other memory cell state) to apply the write to the cacheline in array 360. In one embodiment, system 300 selects only some of the entries in the dequeuing buffer (e.g., depending on the selection criteria that indicates how many cachelines to dequeue). Thus, address decoder 350 may empty the current dequeue buffer over multiple operations (again, depending on the depth of the buffers and the mechanism used to select how many cachelines to dequeue). In one embodiment, system 300 selects a number of cachelines to dequeue based on how much current is available (i.e., how many cachelines can be written simultaneously with the amount of current available).

Figure 4:
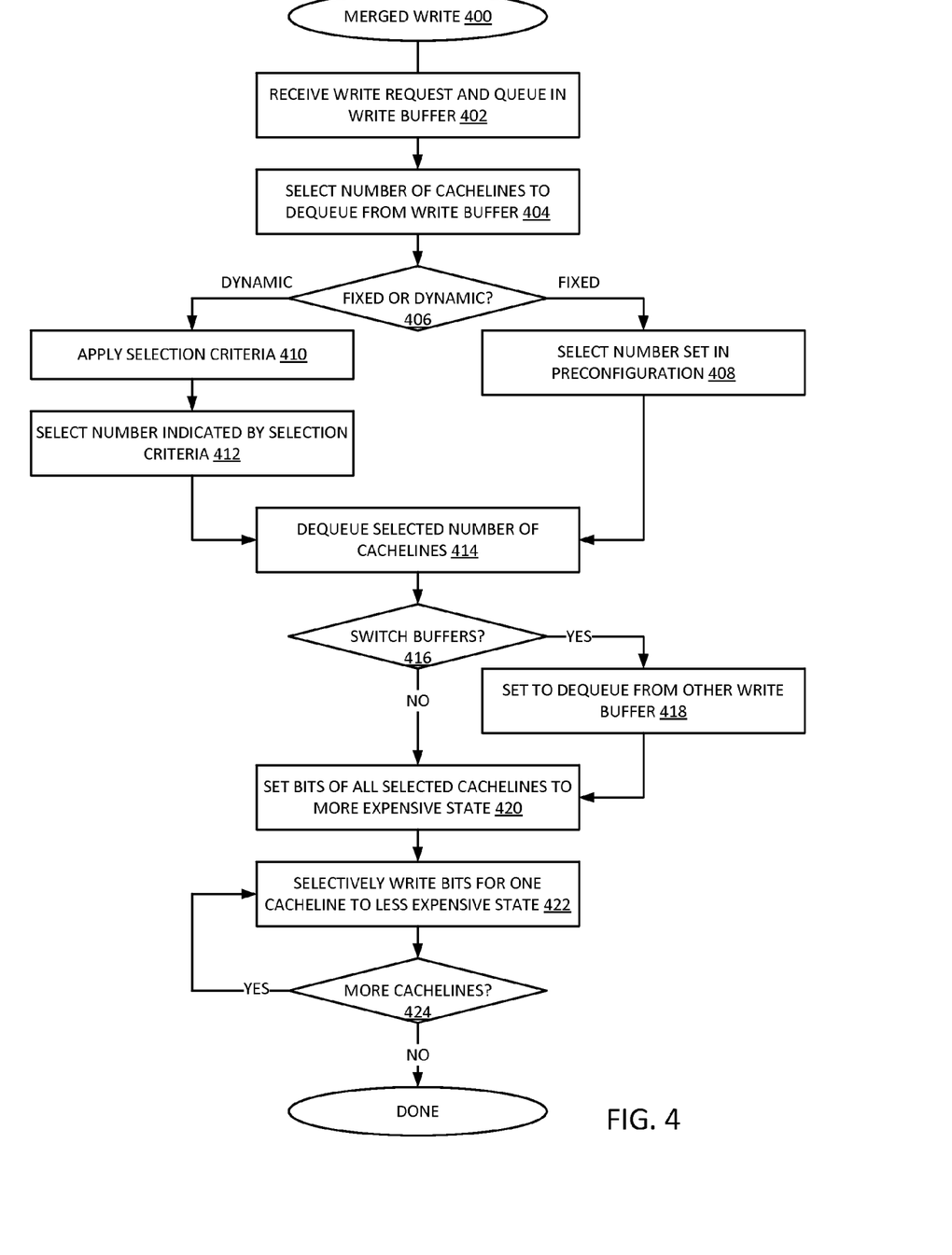
FIG. 4 is a flow diagram of an embodiment of a process for applying a merged reset write operation to amortize write latency.

FIG. 4 is a flow diagram of an embodiment of a process for applying a merged reset write operation to amortize write latency. Process 400 for a merged write operation starts with receiving a write request, which the memory device queues in a write buffer, 402. The memory device (e.g., via control logic) selects a number of cachelines to dequeue from the write buffer for a merged write operation, 404. The merged write operation includes a simultaneous reset or setting of all cachelines to a common memory cell state, and then selectively writing bits of the other state to each cacheline individually.

In one embodiment, the number of cachelines to dequeue or select at a time is fixed. In one embodiment, the memory device can dynamically select the number of cachelines. In a fixed number implementation, 406 Fixed, the memory device selects a preconfigured number of cachelines, 408. The preconfiguration can be set in hardware and/or software. In a dynamic number implementation, 406 Dynamic, in one embodiment, the memory device applies one or more selection criteria to determine how many cachelines to select, 410. The memory device then selects the number of cachelines indicated by the selection criteria, 412. In one embodiment, the number of cachelines could be different for each operation. In one embodiment, the number will be set by the system configuration and should be fairly consistent across different operations within a system, but can be different from system to system.

The memory device dequeues the selected number of cachelines, 414, whether a fixed number or a dynamic number. In one embodiment, the memory device includes two write buffers that rotate roles. In such an implementation, the system can determine whether to switch the roles of the buffers. Thus, the buffer being filled with incoming data will become the buffer from which the address decoder dequeues data, and vice versa. If the buffers are to be switched, 416 YES branch, the control logic of the memory device can set logic to select dequeuing from the other write buffer, 418. If the buffers are not to be switched, 416 NO branch, the memory device will continue to operate by dequeuing from the same write buffer on the following operation. It will be understood that in some implementations, the write buffers will be switched on every write operation, because the address decoder will dequeue all data queued in the buffer.

The address decoder selects all cachelines associated with the dequeued data, and the memory device sets all bits of all selected cachelines to the slower memory cell state, 420. The memory device then writes the data for each of the cachelines in the respective cachelines. Thus, the address decoder will select one cacheline at a time, and the memory device will selectively write bits for a single cacheline to the less expensive memory cell state, 422. The address decoder will continue to select a single cacheline and set bits to the less expensive memory cell state in accordance with the data to be written to the cacheline as long as there are more cachelines to be written, 424 YES branch. When all cachelines have been written, the write operation ends. In one embodiment, the memory controller switches buffers after writing all cachelines.

Figure 5:
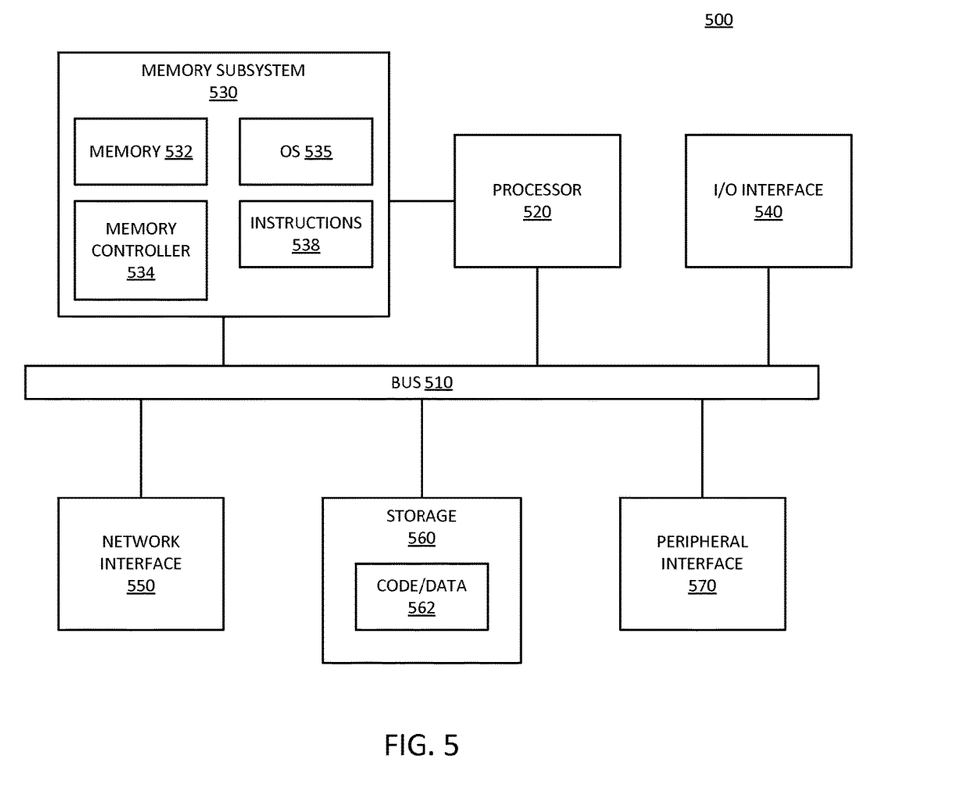
FIG. 5 is a block diagram of an embodiment of a computing system in which a merged reset write operation can be implemented.

FIG. 5 is a block diagram of an embodiment of a computing system in which a merged reset write operation can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

In one embodiment, memory subsystem 530 includes memory device 532 that performs merged write operations in accordance with any embodiment described herein. One or more memory devices 532 have an asymmetric write architecture where one memory cell state takes longer to write than the other state. For example, one or more memory device 532 can be an STTRAM. In one embodiment, storage 560 includes one or more STTRAM devices that perform merged write operations in accordance with any embodiment described herein.

Figure 6:
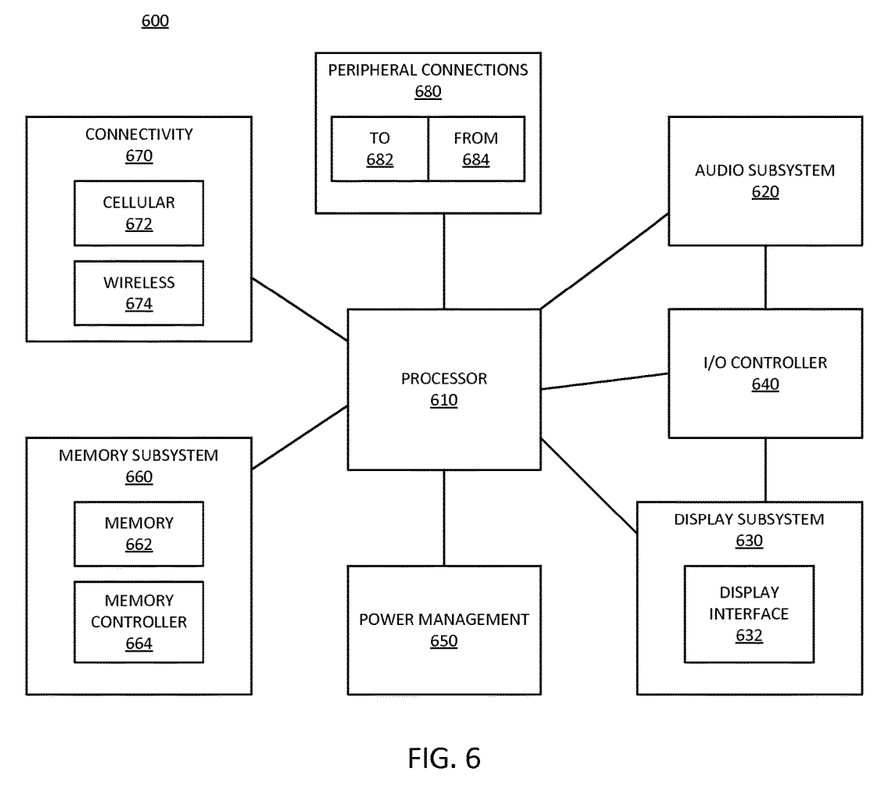
FIG. 6 is a block diagram of an embodiment of a mobile device in which a merged reset write operation can be implemented.

FIG. 6 is a block diagram of an embodiment of a mobile device in which a merged reset write operation can be implemented. Device 600 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 660 includes memory device 662 that performs merged write operations in accordance with any embodiment described herein. One or more memory devices 662 have an asymmetric write architecture where one memory cell state takes longer to write than the other state. For example, one or more memory device 662 can be an STTRAM.

In one aspect, a method for writing a memory device includes: dequeuing a number greater than one of cachelines to perform write operations in a memory device, wherein each cacheline includes a row of memory cells, each memory cell controlled by three separate control lines, wherein writing to a first memory cell state takes longer than writing to a second memory cell state; setting all of the memory cells of the number of cachelines to the first memory cell state in a single write operation; and executing write operations to the number of cachelines individually to selectively write memory cells of the respective cachelines to the second memory cell state.

In one embodiment, the first memory cell state is zero, and the second memory cell state is one. In one embodiment, the memory device comprises a magnetoresistive memory device. In one embodiment, the memory device comprises a spin transfer torque (STT) memory device. In one embodiment, dequeuing the number of cachelines further comprises: dynamically selecting the number of cachelines to dequeue. In one embodiment, dynamically selecting the number of cachelines to dequeue further comprises: determining how much current is available in the memory device to perform the single write operation; and selecting a maximum number of cachelines within a limit of how much current is available. In one embodiment, dequeuing the number of cachelines further comprises: dequeuing from one of two write buffers, wherein one buffer is designated as filled and the other buffer is designated as being filled, wherein the buffers rotate designations based on when the buffer being filled becomes full.

In one aspect, a memory circuit for performing a write operation with a multi-cacheline reset operation, the memory circuit includes: a memory cell array managed as multiple cachelines, wherein each cacheline includes a row of memory cells, each memory cell controlled by three separate control lines, wherein writing to a first memory cell state takes longer than writing to a second memory cell state; a write buffer to hold data to write to the multiple cachelines; and write logic to dequeue a number greater than one of cachelines to perform write operations, set all of the memory cells of the number of cachelines to the first memory cell state in a single write operation, and execute write operations to the number of cachelines individually to selectively write memory cells of the respective cachelines to the second memory cell state.

In one embodiment, the first memory cell state is zero, and the second memory cell state is one. In one embodiment, the memory circuit comprises a magnetoresistive memory circuit. In one embodiment, the memory circuit comprises a spin transfer torque (STT) memory circuit. In one embodiment, the write logic is further to dynamically select the number of cachelines to dequeue. In one embodiment, the write logic is to dynamically select the number of cachelines to dequeue by determining how much current is available in the memory circuit to perform the single write operation; and selecting a maximum number of cachelines within a limit of how much current is available. In one embodiment, the write buffer comprises two separate buffers, a first buffer to queue new write commands, and a second buffer to be dequeued for the single write operation, wherein the two buffers switch based on the second buffer becoming empty.

In one aspect, a system includes: a memory circuit including a memory cell array managed as multiple cachelines, wherein each cacheline includes a row of memory cells, each memory cell controlled by three separate control lines, wherein writing to a first memory cell state takes longer than writing to a second memory cell state; a write buffer to hold data to write to the multiple cachelines; and write logic to dequeue a number greater than one of cachelines to perform write operations, set all of the memory cells of the number of cachelines to the first memory cell state in a single write operation, and execute write operations to the number of cachelines individually to selectively write memory cells of the respective cachelines to the second memory cell state; and a touchscreen display coupled to generate a display based on data accessed from the memory circuit.

In one embodiment, the first memory cell state is zero, and the second memory cell state is one. In one embodiment, the memory circuit comprises a magnetoresistive memory circuit. In one embodiment, the memory circuit comprises a spin transfer torque (STT) memory circuit. In one embodiment, the write logic is further to dynamically select the number of cachelines to dequeue. In one embodiment, the write logic is to dynamically select the number of cachelines to dequeue by determining how much current is available in the memory circuit to perform the single write operation; and selecting a maximum number of cachelines within a limit of how much current is available. In one embodiment, the write buffer comprises two separate buffers, a first buffer to queue new write commands, and a second buffer to be dequeued for the single write operation, wherein the two buffers switch based on the second buffer becoming empty.

In one aspect, an article of manufacture comprising a computer readable storage medium having content stored thereon, which when executed performs operations for writing a memory device, including: dequeuing a number greater than one of cachelines to perform write operations in a memory device, wherein each cacheline includes a row of memory cells, each memory cell controlled by three separate control lines, wherein writing to a first memory cell state takes longer than writing to a second memory cell state; setting all of the memory cells of the number of cachelines to the first memory cell state in a single write operation; and executing write operations to the number of cachelines individually to selectively write memory cells of the respective cachelines to the second memory cell state.

In one embodiment, the first memory cell state is zero, and the second memory cell state is one. In one embodiment, the memory device comprises a magnetoresistive memory device. In one embodiment, the memory device comprises a spin transfer torque (STT) memory device. In one embodiment, the content for dequeuing the number of cachelines further comprises content for dynamically selecting the number of cachelines to dequeue. In one embodiment, the content for dynamically selecting the number of cachelines to dequeue further comprises content for determining how much current is available in the memory device to perform the single write operation; and selecting a maximum number of cachelines within a limit of how much current is available. In one embodiment, the content for dequeuing the number of cachelines further comprises content for dequeuing from one of two write buffers, wherein one buffer is designated as filled and the other buffer is designated as being filled, wherein the buffers rotate designations based on when the buffer being filled becomes full.

In one aspect, an apparatus for writing a memory device includes: means for dequeuing a number greater than one of cachelines to perform write operations in a memory device, wherein each cacheline includes a row of memory cells, each memory cell controlled by three separate control lines, wherein writing to a first memory cell state takes longer than writing to a second memory cell state; means for setting all of the memory cells of the number of cachelines to the first memory cell state in a single write operation; and means for executing write operations to the number of cachelines individually to selectively write memory cells of the respective cachelines to the second memory cell state.

In one embodiment, the first memory cell state is zero, and the second memory cell state is one. In one embodiment, the memory device comprises a magnetoresistive memory device. In one embodiment, the memory device comprises a spin transfer torque (STT) memory device. In one embodiment, the means for dequeuing the number of cachelines further comprises: means for dynamically selecting the number of cachelines to dequeue. In one embodiment, the means for dynamically selecting the number of cachelines to dequeue further comprises: means for determining how much current is available in the memory device to perform the single write operation; and means for selecting a maximum number of cachelines within a limit of how much current is available. In one embodiment, the means for dequeuing the number of cachelines further comprises: means for dequeuing from one of two write buffers, wherein one buffer is designated as filled and the other buffer is designated as being filled, wherein the buffers rotate designations based on when the buffer being filled becomes full.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for writing a memory device, comprising:
   dequeuing a number greater than one of cachelines to perform write operations in a memory device, wherein each cacheline includes a row of memory cells, each memory cell controlled by three separate control lines, wherein writing to a first memory cell state takes longer than writing to a second memory cell state;
   setting all of the memory cells of the number of cachelines to the first memory cell state in a single write operation; and
   executing write operations to the number of cachelines individually to selectively write memory cells of the respective cachelines to the second memory cell state.

2. The method of claim 1, wherein the first memory cell state is zero, and the second memory cell state is one.

3. The method of claim 1, wherein the memory device comprises a magnetoresistive memory device.

4. The method of claim 3, wherein the memory device comprises a spin transfer torque (STT) memory device.

5. The method of claim 1, wherein dequeuing the number of cachelines further comprises:
   dynamically selecting the number of cachelines to dequeue.

6. The method of claim 5, wherein dynamically selecting the number of cachelines to dequeue further comprises:
   determining how much current is available in the memory device to perform the single write operation; and
   selecting a maximum number of cachelines within a limit of how much current is available.

7. The method of claim 1, wherein dequeuing the number of cachelines further comprises:
   dequeuing from one of two write buffers, wherein one buffer is designated as filled and the other buffer is designated as being filled, wherein the buffers rotate designations based on when the buffer being filled becomes full.

8. A memory circuit for performing a write operation with a multi-cacheline reset operation, the memory circuit comprising:
   a memory cell array managed as multiple cachelines, wherein each cacheline includes a row of memory cells, each memory cell to be controlled by three separate control lines, wherein a write of a memory cell to a first memory cell state takes longer than a write of the memory cell to a second memory cell state;

a write buffer to hold data to write to the multiple cachelines; and write logic to dequeue a number greater than one of cachelines to perform write operations, set all of the memory cells of the number of cachelines to the first memory cell state in a single write operation, and execute write operations to the number of cachelines individually to selectively write memory cells of the respective cachelines to the second memory cell state.

9. The memory circuit of claim 8, wherein the first memory cell state is zero, and the second memory cell state is one.

10. The memory circuit of claim 8, wherein the memory circuit comprises a magnetoresistive memory circuit.

11. The memory circuit of claim 10, wherein the memory circuit comprises a spin transfer torque (STT) memory circuit.

12. The memory circuit of claim 8, wherein the write logic is further to dynamically select the number of cachelines to dequeue.

13. The memory circuit of claim 12, wherein the write logic is to dynamically select the number of cachelines to dequeue including to determine how much current is available in the memory circuit to perform the single write operation; and to select a maximum number of cachelines within a limit of how much current is available.

14. The memory circuit of claim 8, wherein the write buffer comprises two separate buffers, a first buffer to queue new write commands, and a second buffer to be dequeued for the single write operation, wherein the two buffers switch based on the second buffer becoming empty.

15. A system comprising:

a memory circuit including a memory cell array managed as multiple cachelines, wherein each cacheline includes a row of memory cells, each memory cell to be controlled by three separate control lines, wherein a write of a memory cell to a first memory cell state takes longer than a write of the memory cell to a second memory cell state;

a write buffer to hold data to write to the multiple cachelines; and write logic to dequeue a number greater than one of cachelines to perform write operations, set all of the memory cells of the number of cachelines to the first memory cell state in a single write operation, and execute write operations to the number of cachelines individually to selectively write memory cells of the respective cachelines to the second memory cell state; and a touchscreen display coupled to generate a display based on data accessed from the memory circuit.

16. The system of claim 15, wherein the first memory cell state is zero, and the second memory cell state is one.

17. The system of claim 15, wherein the memory circuit comprises a spin transfer torque (STT) memory circuit.

18. The system of claim 15, wherein the write logic is further to dynamically select the number of cachelines to dequeue.

19. The system of claim 18, wherein the write logic is to dynamically select the number of cachelines to dequeue including to determine how much current is available in the memory circuit to perform the single write operation; and to select a maximum number of cachelines within a limit of how much current is available.

20. The system of claim 15, wherein the write buffer comprises two separate buffers, a first buffer to queue new write commands, and a second buffer to be dequeued for the single write operation, wherein the two buffers switch based on the second buffer becoming empty.

* * * * *